United States Patent
Johnson et al.

(10) Patent No.: US 7,177,231 B2
(45) Date of Patent: *Feb. 13, 2007

(54) SELECTABLE CLOCK INPUT

(75) Inventors: Christopher S. Johnson, Meridian, ID (US); Scott Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/270,578

(22) Filed: Nov. 10, 2005

(65) Prior Publication Data

US 2006/0062056 A1    Mar. 23, 2006

Related U.S. Application Data

(60) Division of application No. 10/747,225, filed on Dec. 30, 2003, now Pat. No. 6,990,041, which is a continuation of application No. 09/939,653, filed on Aug. 28, 2001, now Pat. No. 6,687,184.

(51) Int. Cl.
    *G11C 8/00*    (2006.01)
(52) U.S. Cl. .................. 365/233; 365/230.01

(58) Field of Classification Search ............... 365/233, 365/230.01
    See application file for complete search history.

(56) References Cited

U.S. PATENT DOCUMENTS

| | | | |
|---|---|---|---|
| 5,812,491 A | 9/1998 | Shinozaki et al. | |
| 5,903,747 A | 5/1999 | Casal | |
| 6,104,668 A | 8/2000 | Lee et al. | |
| 6,215,725 B1 | 4/2001 | Komatsu | |
| 6,337,832 B1* | 1/2002 | Ooishi et al. | 365/233 |
| 6,470,467 B2* | 10/2002 | Tomishima et al. | 714/744 |
| 6,472,904 B2* | 10/2002 | Andrews et al. | 326/38 |
| 6,522,599 B2 | 2/2003 | Ooishi et al. | |
| 6,687,184 B2* | 2/2004 | Johnson et al. | 365/233 |
| 6,757,212 B2 | 6/2004 | Hamamoto et al. | |

* cited by examiner

*Primary Examiner*—Tuan T. Nguyen
(74) *Attorney, Agent, or Firm*—Dickstein Shapiro LLP

(57) ABSTRACT

The present invention provides a memory device having a mode register with a selectable bit which sets the memory device to operate with a selected one of a plurality of possible clock input signals, for example, a single clock input or differential clock input.

7 Claims, 4 Drawing Sheets

SELECTABLE CLOCK INPUT

This is a divisional application of U.S. patent application Ser. No. 10/747,225, filed on Dec. 30, 2003, now U.S. Pat. No. 6,990,041, issued on Jan. 24, 2006, which is a continuation of U.S. patent application Ser. No. 09/939,653, filed on Aug. 28, 2001, now U.S. Pat. No. 6,687,184, issued on Feb. 3, 2004, the disclosures of which are incorporated by reference herein.

FIELD OF THE INVENTION

The present invention relates generally to memory devices, and more particularly, to a memory device having a selectable clock input.

BACKGROUND OF THE INVENTION

Memory devices such as Dynamic Random Access Memories (DRAM) and Synchronous Dynamic Random Access Memories (SDRAM) are regularly used in computing systems for applications ranging from video games to personal computers.

An SDRAM usually includes components such as memory arrays, row and column decoders, and control logic. Additionally, an SDRAM typically includes a mode register for setting an operation mode so that the SDRAM can perform various functions that are optimally selected for the system containing the SDRAM. The mode register may allow external setting of operation modes; that is, it may have its set values changed in response to an externally supplied signal. An external clock signal is also used for memory devices to synchronize the operation of the memory device with other components of the computing system.

The computing systems within which SDRAMs function usually operate with a predetermined clock input which can be a single clock input or a differential clock input. While a differential clock input system may be preferable for characteristics such as low noise, some point to point systems exist where a single clock input is preferred.

To accommodate a single clock input system and a differential clock input system, SDRAMs have to be selected according to, among other features, whether or not the SDRAM's components can accommodate the clock in the system with which the SDRAM is to be used. This need for multiple types of SDRAMs imposes not only additional manufacturing costs to produce different types of SDRAMs for various systems, but also storage, distribution, and other logistical costs.

What is needed is a memory device capable of accommodating more than one clock input system, for example, a single clock input system and a differential clock input system.

SUMMARY OF THE INVENTION

The shortcomings discussed above are largely overcome by the present invention which in one aspect provides a synchronous memory device with a mode register having a user selectable bit, the state of which internally configures the memory device to operate with either a single clock input or a differential clock input.

In another aspect, the present invention provides a memory device which has a mode register in its control logic which has a user selectable bit position which can be set to enable the control logic to appropriately control the operation of the memory device with different types of applied clock input signals.

In another aspect, the present invention provides a method for operating a memory system by providing a memory controller and a memory device having a mode register, initializing the memory system to operate with a first clock input signal by sending a signal from the memory controller to the mode register setting the memory device to operate at the first clock input signal, and changing the memory system to operate at a second clock input signal by sending a signal from the memory controller to the mode register to operate the memory device at the second clock input signal, wherein the second clock input signal is different from the first clock input signal.

These and other features and advantages of the present invention will be more clearly apparent from the detailed description which is provided in connection with accompanying drawings which illustrate exemplary embodiments of the invention.

DETAILED DESCRIPTION OF THE INVENTION

Figure 1:
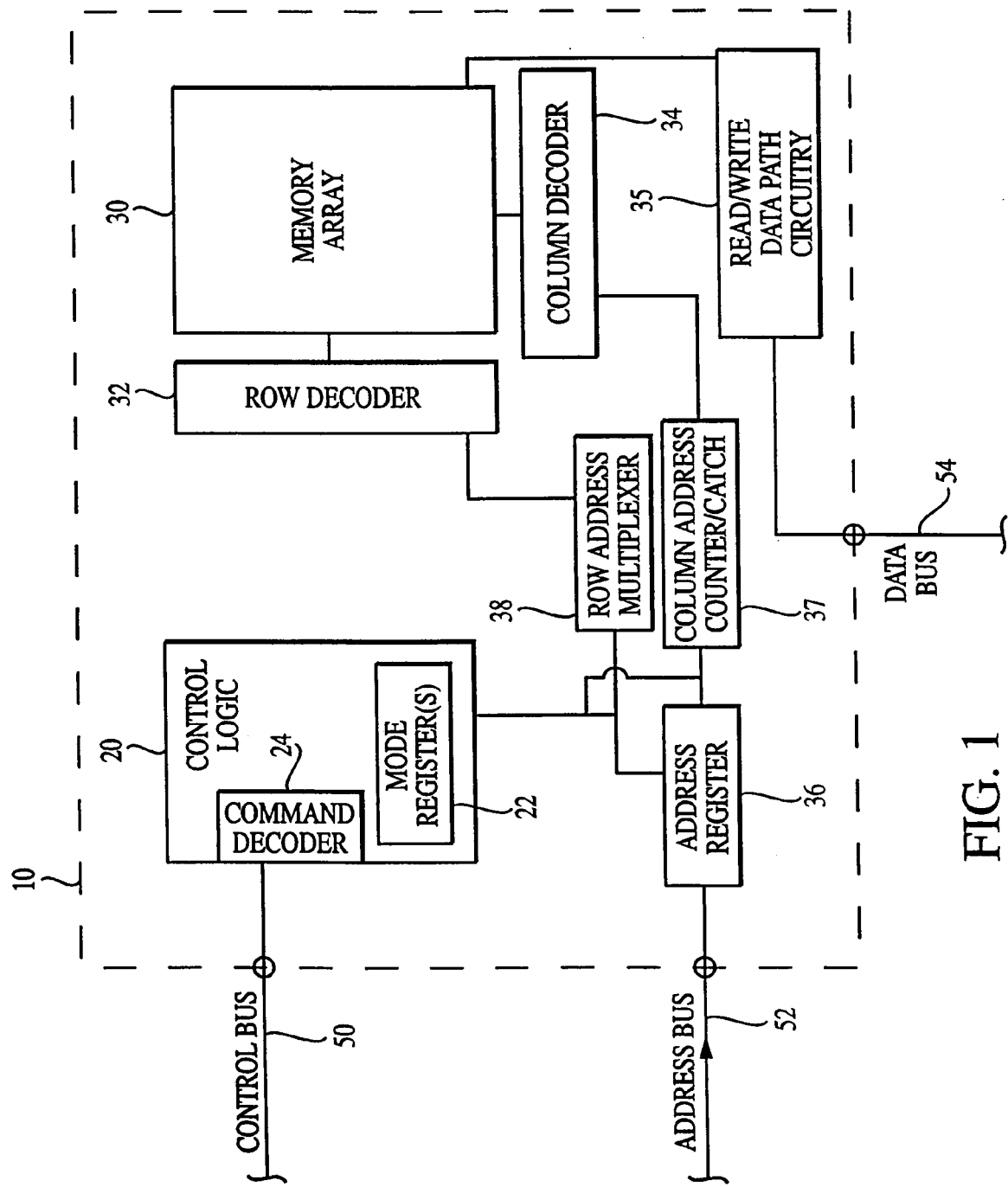
FIG. 1 is a diagram of a portion of an SDRAM in accordance with an embodiment of the present invention.

Referring now to the drawings, where like parts are designated by like reference numbers throughout, there is shown in FIG. 1 a simplified block diagram of an SDRAM 10 in accordance with an embodiment of the present invention. Although the term SDRAM is used throughout this specification, the present invention is applicable to any DRAM technology which uses a clock, and for use in any computing system such as a game, a video card, and a computer system.

The SDRAM 10 has a control logic 20 that contains a mode register 22 and a command decoder 24. The SDRAM 10 also has a memory array 30, a row decoder 32 and a column decoder 34, and an address register 36. Multiple memory arrays 30 may be provided in the SDRAM 10, along with multiple row decoders 32 and column decoders 34. A row address multiplexer 38, a column address counter/latch 37, and read/write data path components are also provided within the SDRAM 10. The SDRAM 10 interfaces with external components through a control bus 50, an address bus 52, and a data bus 54.

Figure 2:
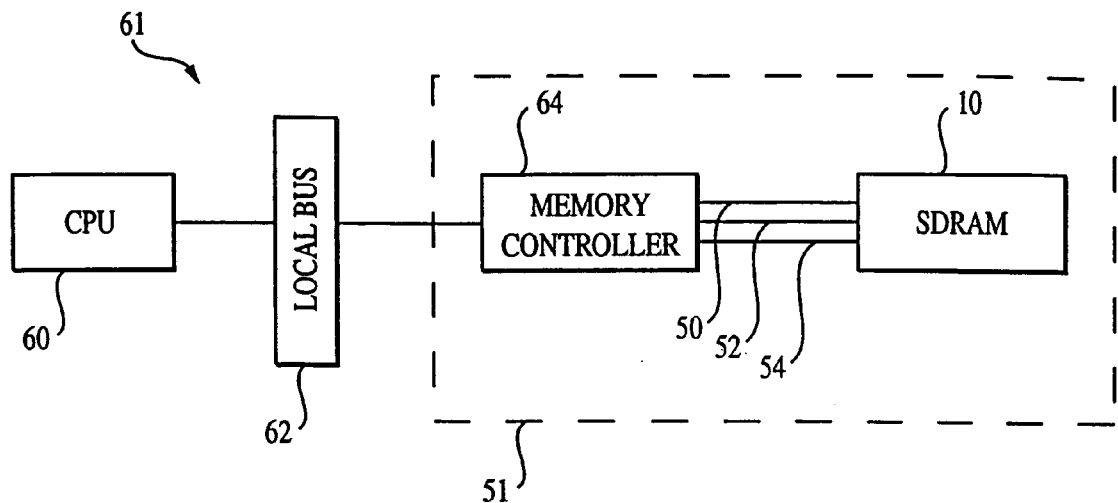
FIG. 2 is a diagram of a computer and memory system using the SDRAM illustrated in FIG. 1.
Figure 3:
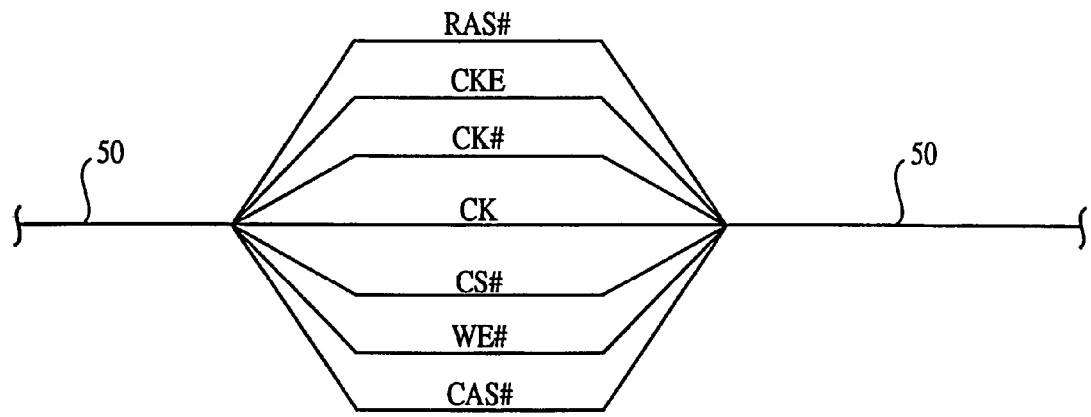
FIG. 3 is a diagram of a control bus which may be used with the SDRAM illustrated in FIG. 1.

The SDRAM 10 may be used as part of a memory system 51 which in turn is used in a computing system, such as computer system 61 shown in FIG. 2. The computer system 61, which may employ multiple SDRAMs 10, has a CPU 60 and a memory controller 64 which is part of memory system 51. Alternatively, the CPU 60 may provide the memory controller functions. The CPU 60 and the memory controller 64 communicate via a local bus 62. The memory controller 64, in turn, communicates with the SDRAM(s) 10 via the control bus 50, address bus 52, and data bus 54. As illustrated in FIG. 3, the control bus 50 may include multiple signal lines, including a row address strobe line RAS#, a clock enable line CKE, a chip select line CS#, a write enable line WE#, and a column address strobe line CAS#.

Figure 4:
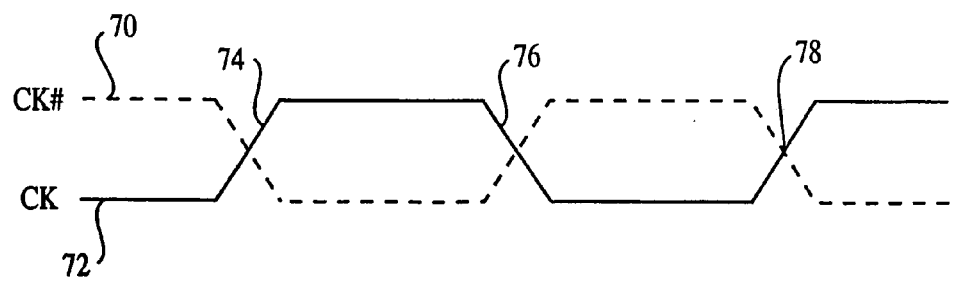
FIG. 4 is a diagram of a clock input.

The control bus 50 also includes a clock signal line CK, and may include a complimentary clock signal line CK#. In a single clock input system only the CK signal would be present, while in a differential clock input system both the CK and CK# signals would be present. Clock signals CK 72 and CK# 70 are graphically represented in FIG. 4. The SDRAM 10 synchronizes the output of read data with the rising edges 74 and falling edges 76 of a single clock input system, and with the crossing points 78 of a differential clock input system. Differential clock input systems are also known as double data rate systems. The clock signals are typically generated by a device such as an oscillator, which can be located in a processor, in a memory controller, or anywhere else in a computer system.

In a typical operation of the SDRAM 10, row address and column address signals are asserted by the memory controller 64 on the address bus 52, and latched into the address register 36. The row address signals are then supplied to the row address multiplexer 38 which transmits the row address signal to the row decoder 32, which appropriately accesses a row of the memory array 30. The column address signals are supplied from the address register 36 to the column address counter/latch 37 which transmits the column address to the column decoder 34, which appropriately accesses a column of the memory array 30. As stated above, if the SDRAM contains multiple memory arrays 30, multiple row decoders 32 and column decoders 34 would likewise be provided.

The memory array 30 is coupled to the data bus 54 via read/write data path circuitry 35. The read data path portion of the read/write data path circuitry 35 comprises circuits which store output addressed data and ensures that the proper signal levels are delivered to the data bus 54. The write data path portion of the read/write data path circuitry 35 comprises circuits which accept write data from the data bus 54, hold data to be written, and drive the write data to the addressed areas of memory array 30.

Read and write accesses to the SDRAM 10 are burst oriented, where the burst length determines the maximum number of column locations that can be accessed for a given read or write command. In order to write data, the memory controller 64 asserts a write command on the control bus 50 and subsequently supplies write data to the SDRAM 10 via the data bus 54. In order to read data, the memory controller 64 asserts a read command on the control bus 50 while simultaneously asserting column and row addresses on the address bus 52. The preceding is a cursory description of the SDRAM's 10 operation; the operation may involve numerous additional well known steps involving known components, the descriptions of which are not provided herein for the sake of brevity.

The overall operation of the SDRAM 10 is controlled by the control logic 20 which includes the command decoder 24 and the mode register 22. The command decoder 24 interprets various signal combinations present on the control bus 50 as high level commands asserted by the memory controller 64, thereby allowing the control logic 20 to carry out internal operations of the SDRAM 10 by implementing the asserted commands. The operation of the control logic 20 is further defined by the settings of the mode register 22, which is loaded with values which control various SDRAM operational parameters.

The mode register 22 has bit positions which are used to define specific modes of operation of the SDRAM 10. Binary values are set in the mode register 22 by the memory controller 64. Typical operational states which can be set by binary values set in the mode register 22 include, for example, the selection of a burst length, a burst type, and a CAS latency. The mode register 22 is typically programmed by a command from the memory controller 64 at initialization of the computer system 61, and will retain the stored information until it is programmed again or the SDRAM 10 loses power. Reprogramming the mode register 22 usually does not change the stored contents of the memory array(s) 30.

Figure 5:
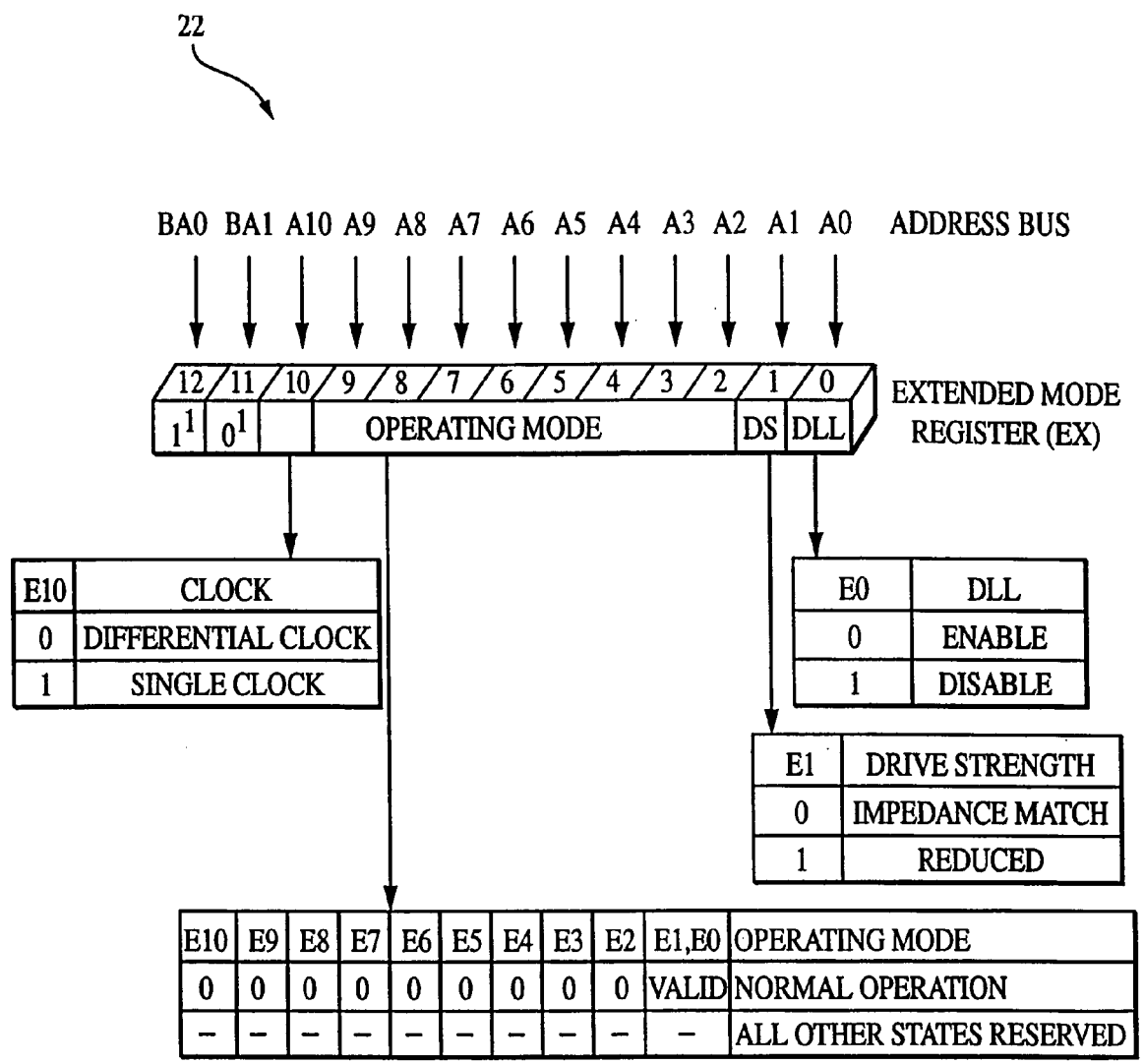
FIG. 5 is a diagram of a mode register employed in the SDRAM shown in FIG. 1.

The mode register 22 of an SDRAM constructed in accordance with an embodiment of the present invention is illustrated in FIG. 5. The mode register 22 has selectable bits A0–A10, BA0, and BA1 used to define the various modes of operation discussed above. Bit A0 defines the enable or disable state of a delay lock loop used to synchronize initial memory operations, bit A1 defines the drive strength for all outputs as normal or reduced, and bits A2–A10 define various operating modes such as load mode register, read, or write. Alternatively, bits A0–A2 may be used to define the burst length, bit A3 may be used to define the burst type, bits A4–A6 may be used to define the CAS latency, and bits A7–A10 may be used to define the operating mode such as normal or reset operation. Although the mode register 22 illustrated in FIG. 5 contains multiple bits and sections, including an extended mode register section, the mode register 22 in accordance with the present invention need not incorporate all those sections. These combinations and operations of mode register bits are illustrative only and are not meant to be restrictive in order to practice the present invention.

A unique feature of mode register 22 in an SDRAM of the present invention is that a selectable bit may be used to define whether or not the control logic, and therefore the SDRAM 10, will operate in a single clock input mode or a differential clock input mode. For the exemplary mode register 22 illustrated in FIG. 5, mode register bit A10 can be set to 0 to enable the control logic 20 to operate the SDRAM 10 with a single clock input, or set to 1 to enable the control logic 20 to operate the SDRAM 10 within a differential clock input. As discussed above, the SDRAM 10 synchronizes the output of read data with the rising edges 74 and falling edges 76 of a single clock input system, and with the crossing point 78 of a differential clock input system. Either a differential clock input or a single clock input can be the default setting for the mode register 22. Although bit A10 controls the clock input signal setting in the illustrated mode register 22, any bit may be used for this function.

The mode register 22 bit controlling the clock signal input setting for the operation of the SDRAM 10 is usually set at initialization of the computer system 61 to operate in agreement with other components of the system. Alternatively, the mode register 22 can be switched to operate between different types of clock inputs after initialization of the computer system 61. For example, the computer system 61 may switch from operating at differential clock input to operating at a single clock input when switching from a regular mode to a power savings mode, or from a regular mode to a test mode. During a power savings mode, it may be advantageous to shut down several components of computer system 61, but to retain the memory stored in the SDRAM 10. For this purpose, a signal may be sent to the memory controller 64 to set the mode register 22, and thereby the control logic 20, to operate at a single clock input, thereby decreasing the amount of power consumed by the computer system 61 and SDRAM memory device. When the computer system 61 is to return to a normal operating mode, a signal would be sent to the memory controller 64 to reset the mode register 22 and control logic 20 to operate with a differential clock input system.

Figure 6:
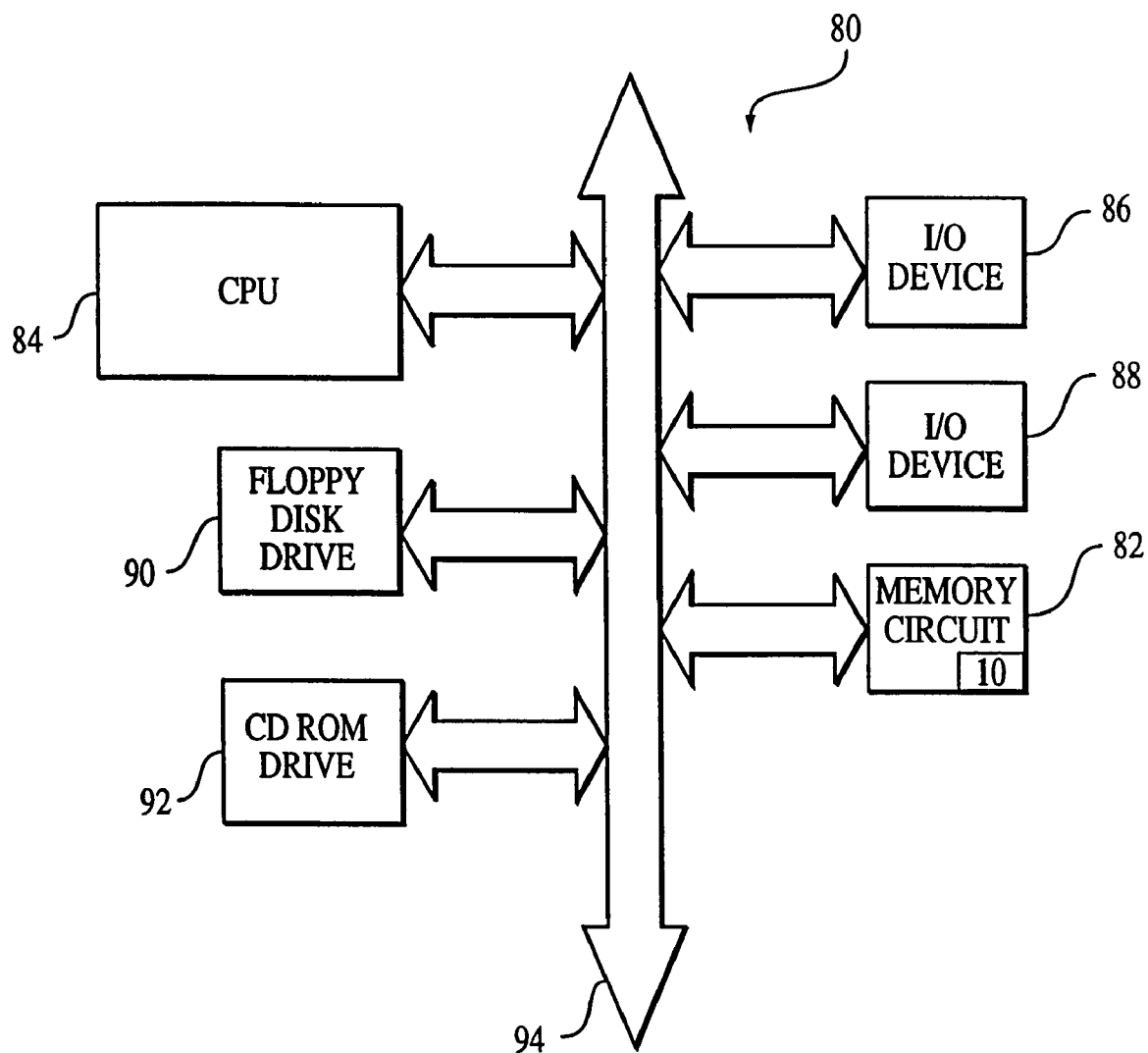
FIG. 6 is diagram of another computer system in accordance with an embodiment of the present invention.

FIG. 6 illustrates an example of a computer system 80 that may incorporate an SDRAM 10 containing a mode register 22 in accordance with the present invention. The system 80 has a memory circuit 82 including an SDRAM 10 constructed in accordance with the present invention. The computer system 80 includes a central processing unit (CPU) 84 for performing computer functions, such as executing software to perform desired tasks and calculations. One or more input/output devices 86, 88, such as a keypad or a mouse, are coupled to the CPU 84 and allow an operator to manually input data thereto or to display or otherwise output data generated by the CPU 84. One or more peripheral devices such as a floppy disk drive 90 or a CD ROM drive 92 may also be coupled to the CPU 84. The computer system 80 also includes a bus 94 that couples the input/output devices 86, 88 and the memory circuit 82 to the CPU 84.

Thus, the present invention provides a mode register 22 that can enable one SDRAM 10 to operate with both single clock and differential clock input systems. This reduces the need to stock multiple types of SDRAMs, thereby reducing costs associated with manufacturing and stocking multiple types of components. Additionally, the mode register 22 in accordance with the present invention allows for the SDRAM 10 to operate in a computing system designed to switch between differential clock and single clock input signals.

While the foregoing has described in detail preferred embodiments known at the time, it should be readily understood that the invention is not limited to the disclosed embodiments. For example, although the invention has been described with respect to switching SDRAM operation between a single clock input or a differential clock input, it should be apparent that the invention can also be implemented with a suitable mode register input to select among any two or more different types of clock inputs. In addition, the invention can be modified to incorporate any number of variations, alterations, substitutions or equivalent arrangements not heretofore described, but which are commensurate with the spirit and scope of the invention. Accordingly, the invention is not limited to the embodiment specifically described but is only limited by the scope of the appended claims.

What is claimed as new and desired to be protected by Letters Patent of the United States is:

1. A double data rate memory device, comprising:
   a mode register having bits for setting operational parameters for said memory device, wherein at least one of said bits is capable of being set to identify a clock input signal which will be used during operation of said memory device.

2. The memory device according to claim 1, wherein said memory device is capable of operating in response to more than one clock input signal.

3. The memory device according to claim 1 wherein said clock input signal is a single clock input signal.

4. The memory device according to claim 1 wherein said clock input signal is a differential clock input signal.

5. A memory device comprising:
   a memory array; and
   a mode register for storing information for operating said memory array, said mode register having a plurality of bit storage locations wherein at least one of said bit storage locations is capable of storing a bit value which identifies a clock input signal as one of a first input signal and a second input signal, said second signal being different from said first input signal.

6. The memory device according to claim 5, wherein said first input signal is a single clock input and said second input signal is a differential clock input.

7. The memory device according to claim 6 further comprising a control logic circuit, wherein said memory device enables said control logic circuit to selectively operate said memory device with one of said single clock input and said differential clock input.

* * * * *